United States Patent
Umemoto et al.

(10) Patent No.: US 7,205,253 B2
(45) Date of Patent: *Apr. 17, 2007

(54) DIELECTRIC CERAMIC COMPOSITION, METHOD FOR MANUFACTURE THEREOF AND MULTILAYER CERAMIC PART

(75) Inventors: Takashi Umemoto, Hirakata (JP); Hiroshi Nonoue, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 27 days.

This patent is subject to a terminal disclaimer.

(21) Appl. No.: 11/152,079

(22) Filed: Jun. 15, 2005

(65) Prior Publication Data

US 2005/0288172 A1    Dec. 29, 2005

(30) Foreign Application Priority Data

Jun. 23, 2004    (JP) .............................. 2004-184591

(51) Int. Cl.
*C04B 35/465* (2006.01)
*C04B 35/47* (2006.01)

(52) U.S. Cl. .................................... 501/136

(58) Field of Classification Search ................ 501/136
See application file for complete search history.

(56) References Cited

U.S. PATENT DOCUMENTS

| | | | |
|---|---|---|---|
| 6,385,035 B1 * | 5/2002 | Matoba et al. ........... | 361/321.1 |
| 6,559,084 B1 | 5/2003 | Fujikawa et al. | |
| 6,800,577 B2 * | 10/2004 | Mailadil et al. ............ | 501/136 |
| 6,846,767 B2 * | 1/2005 | Kim et al. .................. | 501/136 |
| 2005/0209090 A1 * | 9/2005 | Umemoto et al. .......... | 501/136 |
| 2005/0215418 A1 * | 9/2005 | Umemoto et al. .......... | 501/136 |
| 2005/0288173 A1 * | 12/2005 | Umemoto et al. .......... | 501/136 |

FOREIGN PATENT DOCUMENTS

| | | |
|---|---|---|
| JP | 05-211007 | 8/1993 |
| JP | 2001-031467 | 2/2001 |
| JP | 2003-146742 | 5/2003 |

OTHER PUBLICATIONS

Ezaki, K. et al., "Microwave Dielectric Properties of Cao-Ln$_2$O$_3$-TiO$_2$ Ceramics" Jpn. J. Appl. Phys. vol. 32 (1993) pp. 4319-4322.

* cited by examiner

*Primary Examiner*—Karl Group
(74) *Attorney, Agent, or Firm*—McDermott Will & Emery LLP

(57) ABSTRACT

A dielectric ceramic composition obtained by firing a mixture containing a glass component and a dielectric component represented by the compositional formula $a.\text{Li}_2\text{O-}b.(\text{CaO}_{1-x}\text{—SrO}_x)\text{-}c.\text{R}_2\text{O}_3\text{-}d.\text{TiO}_2$ (wherein x satisfies $0 \leq x < 1$; R is at least one selected from La, Y and other rare-earth metals; and a, b, c and d satisfy $0 \leq a \leq 20$ mol %, $0 \leq b \leq 45$ mol %, $0 < c \leq 20$ mol %, $40 \leq d \leq 80$ mol % and a+b+c+d=100 mol %). The dielectric component is prepared by calcining a raw material. The glass component contains at least a bismuth glass. After the firing, a ratio (second phase/first phase) in X-ray diffraction peak intensity of the second phase containing the rare-earth element to the first phase having a perovskite structure, as a main phase, does not exceed 20%.

9 Claims, 2 Drawing Sheets

DIELECTRIC CERAMIC COMPOSITION, METHOD FOR MANUFACTURE THEREOF AND MULTILAYER CERAMIC PART

BACKGROUND OF THE INVENTION

1. Field of the Invention

The present invention relates to a dielectric ceramic composition for use in multilayer ceramic parts and the like, a method for manufacture thereof and a multilayer ceramic part using the composition.

2. Description of the Related Art

With the recent reduction in size and thickness of electronic parts, there is an increasing need for multilayer ceramic parts. A typical multilayer ceramic part includes, in each layer thereof, an inductor or capacitor circuit formed by using a low-temperature co-fired ceramic (LTCC) which is co-firable with a conductive material such as Ag. Generally, a dielectric ceramic composition containing alumina or other ceramic filler and a glass is used as the low-temperature co-fired material for use in multilayer ceramic parts. However, such a composition has a low dielectric constant of 10 or below and, when applied to an LC filter, shows insufficient dielectric characteristics.

In order for a dielectric ceramic composition to be applicable to an LC filter, it must exhibit a high dielectric constant, a low dielectric loss and a temperature coefficient τf of approximately 0. As a composition which meets such characteristics, a dielectric ceramic composition having a composition of $Li_2O$—$CaO$—$Sm_2O_3$—$TiO_2$ is disclosed in Japanese Patent Laying-Open No. Hei 5-211007.

Also, Japanese Patent Laying-Open No. 2003-146742 discloses a dielectric ceramic composition containing $(Li_{0.5}(Nd, Sm)_{0.5})TiO_3$—$(Ca_{1-x}Nd_{2x/3})TiO_3$ and 3–15% by weight of a $ZnO$—$B_2O_3$—$SiO_2$ based glass frit or an $Li_2O$—$B_2O_3$—$SiO_2$ based glass frit.

However, the dielectric ceramic composition disclosed in Japanese Patent Laying-Open No. Hei 5-211007 is fired at a high temperature of about 1,300° C. and its original composition has made it difficult to be applied to multilayer ceramic parts which require firing at a low temperature of about 900° C.

The dielectric ceramic composition disclosed in Japanese Patent Laying-Open No. 2003-146742 needs to increase its glass loading in order to improve sinterability at a low temperature of about 900° C. The increased glass loading however results in deterioration of dielectric characteristics, which has been a problem.

Also, it is reported in Jpn. J. Appl. Phys., Vol. 32, pp. 4319–4322 that if Ln is Tb in the $CaO$—$Li_2O$-$Ln_2O_3$—$TiO_2$ ceramic, a perovskite phase precipitates as a main phase and $Ln_2Ti_2O_7$ additionally precipitates as a second phase. This second phase is responsible for the reduction in Qf value. The ceramic disclosed therein excludes a glass component and is not a dielectric ceramic composition firable at low temperatures.

SUMMARY OF THE INVENTION

It is an object of the present invention to provide a dielectric ceramic composition which can be sintered even at a low temperature of 1,000° C. or below and shows good dielectric characteristics, a method for manufacture of the composition and a multilayer ceramic part using the composition.

The present invention provides a dielectric ceramic composition which can be obtained by firing a mixture containing a dielectric component and a glass component. The dielectric component is represented by the compositional formula $a.Li_2O\text{-}b.(CaO_{1-x}\text{—}SrO_x)\text{-}c.R_2O_3\text{-}d.TiO_2$ (wherein x satisfies 0≦x<1; R is at least one selected from rare-earth elements; and a, b, c and d satisfy 0≦a≦20 mol %, 0≦b≦45 mol %, 0<c≦20 mol %, 40≦d≦80 mol % and a+b+c+d=100 mol %.). The dielectric component is prepared by calcining a raw material. The glass component contains at least a bismuth glass. After firing, a ratio (second phase/first phase) in X-ray diffraction peak intensity of the second phase containing a rare-earth element to the main or first phase having a perovskite structure does not exceed 20%.

Firing of the mixture such that, after the firing, the ratio (second phase/first phase) in X-ray diffraction peak intensity does not exceed 20%, in accordance with the present invention, results in the provision of the dielectric ceramic composition having superior dielectric properties.

In this invention, the dielectric component is prepared by calcining a raw material. The calcining temperature is preferably at least 1,000° C., more preferably within the range of 1,100–1,300° C. The calcining time is preferably 2–10 hours. The method used to mix the raw material is not particularly specified. A wet mixing method using a ball mill and alcohol may preferably be utilized. After the calcining, the raw material may preferably be again ground in a ball mill by a wet grinding method using alcohol.

The glass component in the present invention contains at least a bismuth glass. This bismuth glass preferably contains 30–80% by weight of $Bi_2O_3$.

In the dielectric ceramic composition of the present invention, the glass component is preferably contained in the amount of 1–10% by weight. The lower amount of the glass component may increase the difficulty of low-temperature firing. The higher amount of the glass component decreases the relative amount of the dielectric component, resulting in deterioration of dielectric characteristics.

The dielectric component in the present invention is represented by the compositional formula $a.Li_2O\text{-}b.(CaO_{1-x}\text{—}SrO_x)\text{-}c.R_2O_3\text{-}d.TiO_2$ (wherein x satisfies 0≦x<1; R is at least one selected from rare-earth elements; and a, b, c and d satisfy 0≦a≦20 mol %, 0≦b≦45 mol %, 0<c≦20 mol %, 40≦d≦80 mol % and a+b+c+d=100 mol %.). In the compositional formula, R denotes at least one rare-earth element. The rare-earth elements include La and Y. The dielectric component in the present invention is not particularly specified, so long as it is represented by the above compositional formula. For example, the one described in Japanese Patent Laying-Open No. Hei 5-211007 can be favorably used.

The second phase in the dielectric ceramic composition of the present invention contains a rare-earth element. Preferably, it further contains Ti. The rare-earth element in the second phase may be Sm and/or Nd, for example.

The dielectric ceramic composition of the present invention can be obtained by mixing the dielectric component and the glass component and firing the resulting mixture. The firing temperature is preferably not higher than 1,000° C., more preferably within the range of 850–950° C.

This invention also provides a method for manufacturing a dielectric ceramic composition by firing a mixture containing a glass component and a dielectric component represented by the compositional formula $a.Li_2O\text{-}b.(CaO_{1-x}\text{—}SrO_x)\text{-}c.R_2O_3\text{-}d.TiO_2$ (wherein x satisfies 0≦x<1; R is at least one selected from rare-earth elements; and a, b, c and d satisfy 0≦a≦20 mol %, 0≦b≦45 mol %, 0<c≦20 mol %, 40≦d≦80 mol % and a+b+c+d=100 mol %.). Characteristically, the method includes a step of calcining a raw material at a temperature of at least 1,000° C. to prepare the dielectric component and a step of mixing the dielectric component with the glass component containing at least a bismuth glass and firing the mixture at a temperature of not exceeding 1,000° C.

In accordance with the manufacturing method of the present invention, a dielectric ceramic composition can be sintered with a high shrinkage, so that sinterability is improved. Also, a dielectric ceramic composition having a high dielectric constant can be manufactured.

The multilayer ceramic part of the present invention has a structure in which a dielectric layer and a conductive layer are placed above each other. The dielectric layer comprises the dielectric ceramic composition of the present invention or the dielectric ceramic composition manufactured by the practice of the manufacturing method of the present invention.

FIGS. 3 and 4 are a perspective view and an exploded perspective view, respectively, which show a multilayer ceramic part in accordance with the present invention. As shown in FIGS. 3 and 4, a conductive layer 2 is provided on a dielectric layer 1. In a particular embodiment, via holes 3 may be formed in the dielectric layer 1. Such dielectric layers are stacked in a pile to constitute the multilayer ceramic part.

The present invention provides a dielectric ceramic composition which can be sintered even at a low temperature of up to 1,000° C. and shows superior dielectric characteristics.

DESCRIPTION OF THE PREFERRED EXAMPLES

The present invention is now described in detail with reference to examples. The following examples illustrate the practice of the present invention but are not intended to be limiting thereof. Suitable changes and modifications can be effected without departing from the scope of the present invention.

Example 1

$Li_2CO_3$, $CaCO_3$, $SrCO_3$, $Sm_2O_3$ and $TiO_2$ were weighed and mixed so as to result in the following composition; $Li_2O$: 9 mol %, CaO: 15 mol %, SrO: 1 mol %, $Sm_2O_3$: 12 mol %, and $TiO_2$: 63 mol %. This mixture was wet mixed in a ball mill for 24 hours by a wet mixing method using alcohol, and then calcined at 1,200° C. for 5 hours. After calcination, the resulting powder was again ground in a ball mill for 24 hours by a wet grinding method using alcohol.

After the grinding treatment, 5% by weight of a glass A (borosilicate glass, "GA-12" manufactured by Nippon Electric Glass Co., Ltd., softening point: about 560° C.) and 1% by weight of a glass B (bismuth glass, $Bi_2O_3$: 75% by weight, $B_2O_3$: 15% by weight, ZnO: 10% by weight, softening point: about 470° C.) were added to the calcined product. Using alcohol as a solvent, they were mixed in a ball mill for 20 hours. A slurry obtained as a result of the mixing treatment was dried, granulated with the addition of an organic binder such as polyvinyl alcohol, classified and then pressed under a pressure of 2,000 $kg/cm^2$ into a product having a predetermined size and shape. This product was debindered at 500° C. for 2 hours and then fired at 900° C. for 5 hours.

Comparative Example 1

The procedure of Example 1 was followed, except that when the raw material was mixed by a wet mixing method and then calcined, the calcining condition was changed from 1,200° C. and 5 hours to 900° C. and 5 hours, to prepare a product of the dielectric ceramic composition.

(Measurement of X-Ray Diffraction Pattern)

Figure 1:
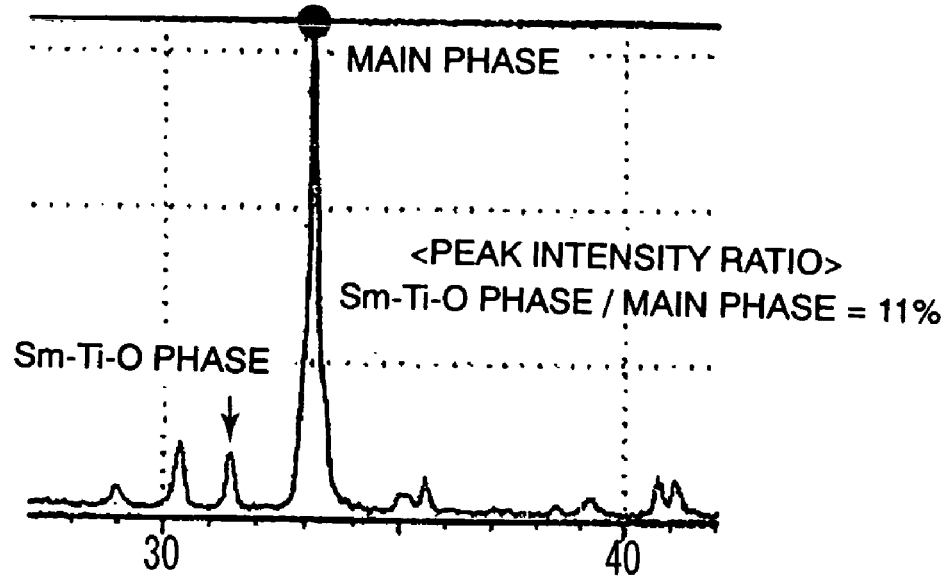
FIG. 1 is a chart showing an X-ray diffraction pattern of Example 1 in accordance with the present invention.

The X-ray diffraction patterns of the samples in Example 1 and Comparative Example 1 were measured. FIG. 1 shows an X-ray diffraction pattern for a sample obtained in Example 1 and FIG. 2 shows an X-ray diffraction pattern for a sample obtained in Comparative Example 1.

Figure 2:
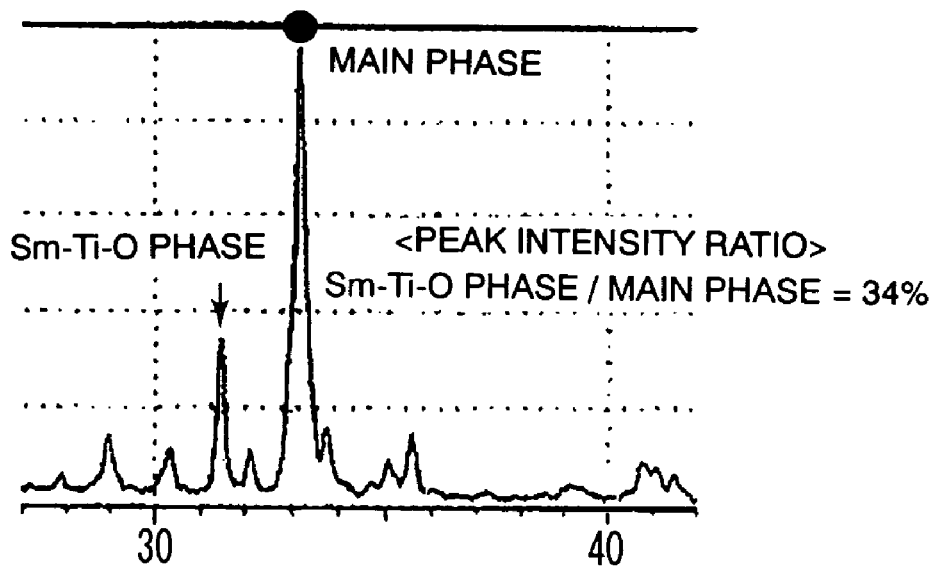
FIG. 2 is a chart showing an X-ray diffraction pattern of Comparative Example 1.

As shown in FIGS. 1 and 2, a sharp peak of a perovskite phase as a main phase appears around 33.1. degree. for each of Example 1 and Comparative Example 1. Also, for both samples of Example 1 and Comparative Example 1, a peak of a second phase appears around 31.4. degree. Hereinafter, this second phase may also be referred to as an Sm—Ti—O phase. A ratio in peak intensity of the second phase to the main first phase is 11% for Example 1 and 34% for Comparative Example 1.

(Analysis of Second Phase by TEM)

The second phase was analyzed by a TEM (transmission electron microscope). A portion appearing relatively white in the reflection electron image was observed as a phase other than the main phase. When this portion was analyzed by EDS (energy dispersive spectroscopy), there were a part where Ti, Sm, Ca and O were detected and another part where Ti, Sm, Bi, Ca and O were detected. The former part existed in a larger extent than the latter part. When crystal systems were analyzed by selected area diffraction (SAD) images, both parts corresponded to a peak position of monoclinic $Ca_{1.38}Sm_{3.1}Ti_{0.52}O_{7.07}$. Therefore, both parts are considered to have crystal structures equivalent or similar to that of this monoclinic compound.

(Measurement of Shrinkage and Dielectric Constant $\in$)

For each of the samples of Example 1 and Comparative Example 1, a dielectric constant was measured using a dielectric resonator method (Hakki-Coleman method). Its shrinkage was also measured from a dimension of the sample prior to and subsequent to firing. The measured shrinkage and dielectric constant $\in$ for each sample are shown in Table 1.

TABLE 1

|  | Calcining Temp. (° C.) | Shrinkage (%) | Dielectric Constant $\epsilon$ | Peak Intensity Ratio (%) (Sm—Ti—O Phase/Main Phase) |
|---|---|---|---|---|
| Comp. Ex. 1 | 900 | 11.7 | 54.3 | 34 |
| Ex. 1 | 1200 | 14.8 | 72.3 | 11 |

As shown in Table 1, the higher shrinkage and dielectric constant are observed for the sample obtained in Example 1 where the calcining temperature was set at 1,200° C. This apparently shows the improved sinterability and dielectric constant.

Examples 2 and 3

The procedure of Example 1 was followed, except that the glass specified in Table 2 was used as the glass component, to prepare samples. The glass C is a bismuth glass having a composition of $Bi_2O_3$(60% by weight)-$B_2O_3$(25% by weight)-ZnO(5% by weight)-$SiO_2$(10% by weight) and a softening point of about 540° C.

As similar to Example 1, each sample was measured for the peak intensity ratio (Sm—Ti—O phase/main phase) in an X-ray diffraction pattern, shrinkage and dielectric constant ∈. The measurement results are shown in Table 2.

TABLE 2

|  | Glass A (wt. %) | Glass B (wt. %) | Glass C (wt. %) | Shringage (%) | Dielectric Constant ∈ | Peak Intensity Ratio (%) (Sm—Ti—O Phase/Main Phase) |
|---|---|---|---|---|---|---|
| Ex. 2 | 1.0 | 1.0 | 0 | 13.0 | 78.9 | 0 |
| Ex. 3 | 1.0 | 0 | 1.0 | 13.8 | 76.2 | 0 |

As shown in Table 2, a peak of the second phase, i.e., the Sm—Ti—O phase, was not detected for the samples of Examples 2 and 3. When compared to the measurement results shown in Table 1 for the sample of Comparative Example 1, it becomes apparent that the samples of Examples 2 and 3 exhibit higher values for both shrinkage and dielectric constant than the sample of Comparative Example 1. This apparently demonstrates the improved sinterability and dielectric constant.

Example 4

Figure 3:
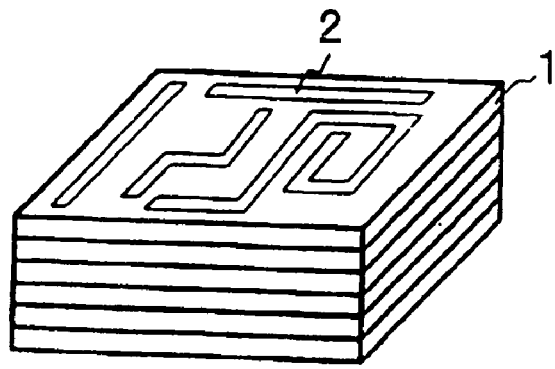
FIG. 3 is a perspective view which shows an embodiment of a multilayer ceramic part of the present invention.
Figure 4:
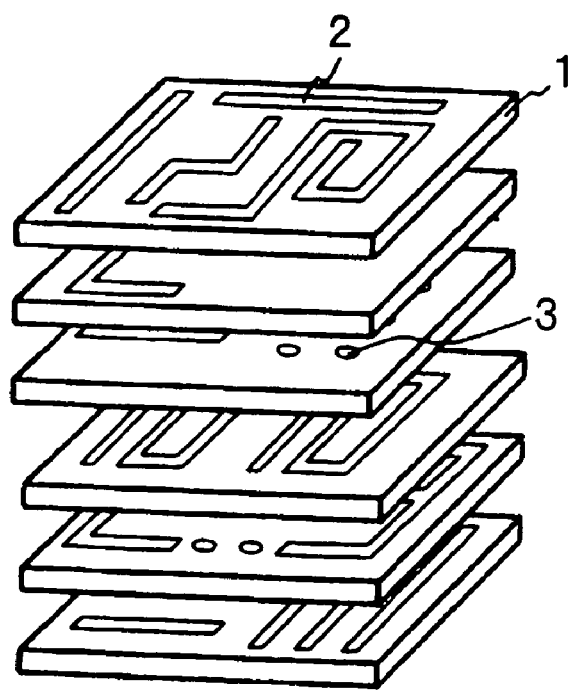
FIG. 4 is an exploded perspective view which shows an embodiment of a multilayer ceramic part of the present invention.

As described earlier, the multilayer ceramic part of the present invention can be obtained by firing multilayers of dielectric green sheets each consisting of a dielectric layer comprising the dielectric ceramic composition of the present invention and a conductive layer formed on a surface of the dielectric layer. For example, a dielectric component is obtained in the same manner as in the preceding Example. A glass component and other additives, if necessary, are added to the dielectric component, followed by mixing in a ball mill. After addition of a polyvinyl butyral (PVB) binder, the resultant is mixed in a ball mill to provide a slurry. The slurry is then formed into a 50–100 μm thick sheet using a doctor blade equipment. The obtained sheet is cut into a desired size. An Ag paste is printed thereon in a desired pattern to provide a dielectric green sheet. 8–20 layers of such green sheets, as shown in FIGS. 3 and 4, are stacked in a pile, bonded compressively, debindered at 400° C. and then fired at 900° C. for 2 hours, resulting in a multilayer ceramic part.

What is claimed is:

1. A dielectric ceramic composition obtained by firing a mixture containing a glass component and a dielectric component represented by the compositional formula $a.Li_2O$-$b.(CaO_{1-x}$—$SrO_x)$-$c.R_2O_3$-$d.TiO_2$ (wherein x satisfies 0≦x<1; R is at least one selected from rare-earth elements; and a, b, c and d satisfy 0≦a≦20 mol %, 0≦b≦45 mol %, 0<c≦20 mol %, 40≦d≦80 mol % and a+b+c+d=100 mol %), wherein said dielectric component is prepared by calcining a raw material; said glass component contains at least a bismuth glass; and after the firing, a ratio (second phase/first phase) in X-ray diffraction peak intensity of the second phase containing the rare-earth element to the first phase having a perovskite structure, as a main phase, does not exceed 20%.

2. The dielectric ceramic composition as recited in claim 1, wherein said second phase further contains Ti.

3. The dielectric ceramic composition as recited in claim 1, wherein said rare-earth element contained in the second phase is Sm and/or Nd.

4. The dielectric ceramic composition as recited in claim 1, wherein said glass component is contained in the amount of 1–10% by weight.

5. The dielectric ceramic composition as recited in claim 1, wherein said calcining is carried out at a temperature of at least 1,000° C.

6. The dielectric ceramic composition as recited in claim 1, wherein said firing is carried out at a temperature of not higher than 1,000° C.

7. A method for manufacture of a dielectric ceramic composition by firing a mixture containing a glass component and a dielectric component represented by the compositional formula $a.Li_2O$-$b.(CaO_{1-x}$—$SrO_x)$-$c.R_2O_3$-$d.TiO_2$ (wherein x satisfies 0≦x<1; R is at least one selected from rare-earth elements; and a, b, c and d satisfy 0≦a≦20 mol %, 0≦b≦45 mol %, 0<c≦20 mol %, 40≦d≦80 mol % and a+b+c+d=100 mol %), said method including the steps of:

calcining a raw material at a temperature of at least 1,000° C. to prepare said dielectric component; and mixing the dielectric component with the glass component containing at least a bismuth glass and firing the mixture at a temperature of not exceeding 1,000° C.

8. A multilayer ceramic part having a structure in which a dielectric layer comprising the dielectric ceramic composition as recited in claim 1 and a conductive layer are placed above each other.

9. A multilayer ceramic part having a structure in which a dielectric layer comprising a dielectric ceramic composition manufactured by the method as recited in claim 7 and a conductive layer are placed above each other.

* * * * *